United States Patent
Hsu (10) Patent No.: US 10,613,932 B2
(45) Date of Patent: Apr. 7, 2020

(54) METHOD FOR CONTROLLING OPERATIONS OF MEMORY DEVICE, ASSOCIATED MEMORY DEVICE AND CONTROLLER THEREOF, AND ASSOCIATED ELECTRONIC DEVICE

(71) Applicant: Silicon Motion Inc., Hsinchu County (TW)

(72) Inventor: Mei-Yu Hsu, Taoyuan (TW)

(73) Assignee: Silicon Motion, Inc., Hsinchu County (TW)

(*) Notice: Subject to any disclaimer, the term of this patent is extended or adjusted under 35 U.S.C. 154(b) by 0 days.

(21) Appl. No.: 16/162,377

(22) Filed: Oct. 16, 2018

(65) Prior Publication Data

US 2019/0146872 A1    May 16, 2019

(30) Foreign Application Priority Data

Nov. 14, 2017    (TW) .............................. 106139328 A (51) Int. Cl.

| | |
|---|---|
| *G06F 12/02* | (2006.01) |
| *G06F 11/10* | (2006.01) |
| *G06F 12/1009* | (2016.01) |
| *G11C 29/42* | (2006.01) |
| *G11C 29/52* | (2006.01) |
| *G06F 3/06* | (2006.01) |
| *H03M 13/00* | (2006.01) |
| *G06F 1/26* | (2006.01) |

(52) U.S. Cl.
CPC .......... *G06F 11/1068* (2013.01); *G06F 3/061* (2013.01); *G06F 3/0632* (2013.01); *G06F 3/0659* (2013.01); *G06F 3/0679* (2013.01); *G06F 11/1012* (2013.01); *G06F 12/0246* (2013.01); *G06F 12/1009* (2013.01); *G11C 29/42* (2013.01); *G11C 29/52* (2013.01); *H03M 13/00* (2013.01); *G06F 1/26* (2013.01); *G06F 2212/7207* (2013.01)

(58) Field of Classification Search
None
See application file for complete search history.

(56) References Cited

U.S. PATENT DOCUMENTS

| | | |
|---|---|---|
| 8,782,490 B2 | 7/2014 | Kim |
| 2013/0219246 A1 | 8/2013 | Kim |
| 2017/0277589 A1 | 9/2017 | Tai |
| 2018/0322042 A1* | 11/2018 | Jang ................... G06F 12/0246 |

* cited by examiner

*Primary Examiner* — Brian R Peugh
(74) *Attorney, Agent, or Firm* — Winston Hsu (57) ABSTRACT

A method for controlling operations of a memory device, the memory device and controller thereof, and an associated electronic device are provided. The method may include: transmitting a read command to a non-volatile (NV) memory to make the NV memory output a data stream; and utilizing a plurality of sub-circuits of a control logic circuit of the controller to perform parallel processing upon the data stream, respectively. Utilizing the sub-circuits to perform parallel processing upon the data stream may include: utilizing a randomizing/de-randomizing and error correction code (ECC) circuit to perform de-randomizing and ECC decoding according to the data stream, wherein this operation is related to initialization of the memory device; and utilizing an empty-page detection circuit to perform empty-page detection according to the data stream, wherein this operation is related to speeding up of the initialization of the memory device.

20 Claims, 5 Drawing Sheets

METHOD FOR CONTROLLING OPERATIONS OF MEMORY DEVICE, ASSOCIATED MEMORY DEVICE AND CONTROLLER THEREOF, AND ASSOCIATED ELECTRONIC DEVICE

BACKGROUND OF THE INVENTION

1. Field of the Invention

The present invention relates to access control of flash memories, and more particularly, to a method for controlling operations of a memory device, the associated memory device and controller thereof, and an associated electronic device.

2. Description of the Prior Art

Developments in memory technology have enabled the wide application of portable memory devices, such as memory cards conforming to SD/MMC, CF, MS and XD specifications. Improving access control of memories in these portable memory devices, however, remains an issue to be solved in the art.

NAND flash memories may comprise single level cell (SLC) and a plurality of level cell (MLC) flash memories. In an SLC flash memory, each transistor used as a memory cell may have either of two electrical charge values: logic values 0 and 1. In comparison, the storage ability of each transistor used as a memory cell in an MLC flash memory may be fully utilized. The transistors are driven by a voltage higher than that in the SLC flash memory, and different voltage levels are utilized to record information of at least two bits (such as 00, 01, 11, or 10). In theory, the recording density of the MLC flash memory may reach at least twice the recording density of the SLC flash memory, and is therefore preferred by manufacturers of NAND flash memories.

The lower cost and larger capacity of the MLC flash memory means it is more likely to be applied in portable memory devices than an SLC flash memory. The MLC flash memory does have instability issues, however. To ensure that access control of the flash memory in the portable memory device meets required specifications, a controller of the flash memory is configured to apply management mechanisms for properly managing data access.

Memory devices inevitably have certain deficiencies, even for those with the above management mechanism. For example, the electronic device cannot use the storage space in the memory device until the initialization of the memory device is completed. Under the situation where the memory device is positioned in the electronic device, the initialization of the electronic device may be postponed by the initialization of the memory device. More specifically, system information of the electronic device may be stored in the memory device, so during boot-up, the electronic device may be unable to read the system information until the initialization of the memory device is completed. The above factor may result in a very long boot-up period of the electronic device. Hence, there is a need for a novel method and memory access mechanism of memory devices which can achieve optimal performance without introducing side effects or in a way that is less likely to introduce side effects.

SUMMARY OF THE INVENTION

One of the objectives of the present invention is to provide a method for controlling operations of a memory device, the associated memory device, its controller, and an associated electronic device, in order to solve the above issue.

Another objective of the present invention is to provide a method for controlling operations of a memory device, the associated memory device, its controller, and an associated electronic device, in order to improve the performance of the memory device without introducing side effects or in a way that is less likely to introduce side effects.

At least one embodiment of the present invention provides a method for controlling operations of a memory device, wherein the memory device comprise a non-volatile memory (NV), and the NV memory comprises at least one NV memory element. The method comprises transmitting a read command to the NV memory, to make the NV memory output a data stream, wherein the data stream represents a page of a block of a plurality of predetermined blocks in the NV memory; and respectively utilizing a plurality of sub-circuits in a control logic circuit of a controller of the memory device to perform parallel processing upon the data stream. The memory device comprises the controller, and the sub-circuits comprise a randomizing/de-randomizing and error correction code (ECC) circuit and an empty-page detection circuit. Respectively utilizing the sub-circuits to perform parallel processing upon the data stream may comprise: utilizing the randomizing/de-randomizing and ECC circuit to perform de-randomizing and ECC decoding according to the data stream, wherein performing de-randomizing and ECC decoding according to the data stream is related to initialization of the memory device; and utilizing the empty-page detection circuit to perform empty-page detection according to the data stream, wherein performing empty-page detection according to the data stream is related to accelerating the initialization of the memory device.

At least one embodiment of the present invention provides a memory device, which may comprise: a NV memory arranged to store information, wherein the NV memory comprises at least one NV memory element; and a controller coupled to the NV memory, the controller arranged to control at least one operation of the memory device. The controller may comprise: a control logic circuit coupled to the NV memory and arranged to control the NV memory; and a processing circuit coupled to the control logic circuit. The control logic circuit may comprise: a randomizing/de-randomizing and ECC circuit arranged to perform at least one of randomizing, de-randomizing, ECC coding and ECC decoding; and an empty-page detection circuit arranged to perform empty-page detection. The processing circuit may control the controller according to a command from a host device, to allow the host device to access the NV memory via the controller. Further, under the control of the processing circuit, the controller may perform the following operations: transmitting a read command to the NV memory, to make the NV memory output a data stream, wherein the data stream represents a page of a block of a plurality of predetermined blocks in the NV memory; and respectively utilizing a plurality of sub-circuits in the control logic circuit to perform parallel processing upon the data stream, wherein the sub-circuits comprise the randomizing/de-randomizing and ECC circuit and the empty-page detection circuit. Respectively utilizing the sub-circuits to perform parallel processing upon the data stream may comprise: utilizing the randomizing/de-randomizing and ECC circuit to perform de-randomizing and ECC decoding according to the data stream, wherein performing de-randomizing and ECC decoding according to the data stream is related to initialization of the memory device; and utilizing the empty-page detection circuit to perform empty-page detection according to the data stream, wherein performing empty-page detection according to the data stream is related to accelerating the initialization of the memory device.

According to some embodiments, the present invention further provides an electronic device which comprises the above-mentioned memory device. The electronic device further comprises the host device coupled to the memory device. The host device may comprise: at least one processer arranged to control operations of the host device; and a power supply circuit coupled to the processer and arranged to provide power to the processer and the memory device. Further, the memory device may provide storage space for the host device.

At least one embodiment of the present invention provides a controller of a memory device, wherein the memory device comprises the controller and an NV memory, and the NV memory comprises at least one NV memory element. The controller may comprise: a control logic circuit coupled to the NV memory and arranged to control the NV memory; and a processing circuit coupled to the control logic circuit. The control logic circuit may comprise: a randomizing/de-randomizing and ECC circuit arranged to perform at least one of randomizing, de-randomizing, ECC coding and ECC decoding; and an empty-page detection circuit arranged to perform empty-page detection. For example, the processing circuit may control the controller according to a command from a host device, to allow the host device to access the NV memory via the controller. Further, under the control of the processing circuit, the controller may perform the following operations: transmitting a read command to the NV memory, to make the NV memory output a data stream, wherein the data stream represents a page of a block within a plurality of predetermined blocks in the NV memory; and respectively utilizing a plurality of sub-circuits in the control logic circuit to perform parallel processing upon the data stream, wherein the sub-circuits comprise the randomizing/de-randomizing and ECC circuit and the empty-page detection circuit. Respectively utilizing the sub-circuits to perform parallel processing upon the data stream comprises: utilizing the randomizing/de-randomizing and ECC circuit to perform de-randomizing and ECC decoding according to the data stream, wherein performing de-randomizing and ECC decoding according to the data stream is related to initialization of the memory device; and utilizing the empty-page detection circuit to perform empty-page detection according to the data stream, wherein performing empty-page detection according to the data stream is related to accelerating the initialization of the memory device.

An advantage of the present invention is that operations of the memory device can be provided with proper controls, thereby preventing the initialization of the electronic device from being delayed by the initialization of the memory device. In addition, implementing the embodiments of the present invention will not greatly increase additional costs. Problems existing in the related arts can therefore be solved without greatly increasing the overall cost. The present invention may achieve optimal performance without introducing side effects or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

I. Memory System

Figure 1:
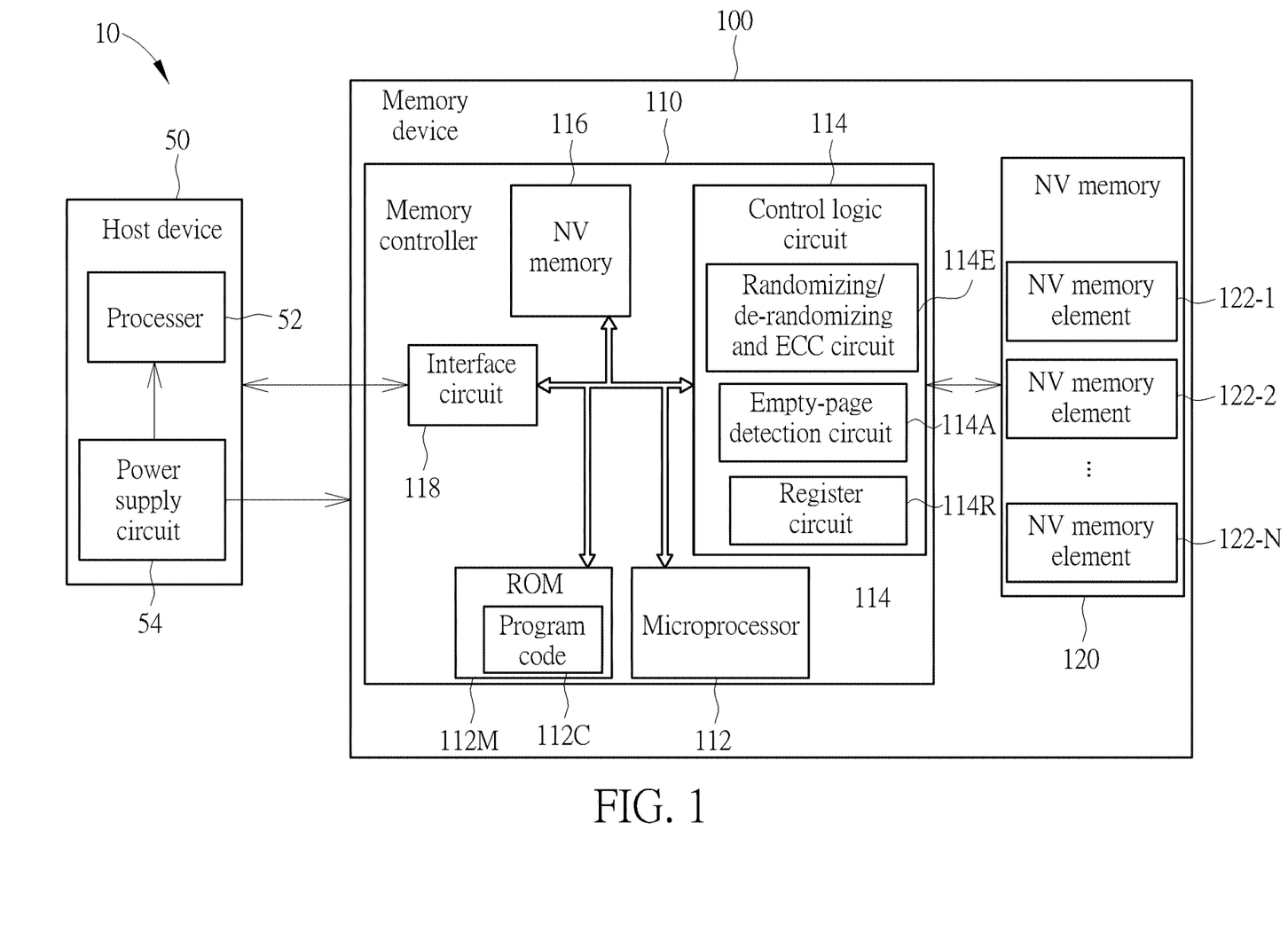
FIG. 1 is a diagram illustrating an electronic device according to an embodiment of the present invention.

FIG. 1 is a diagram illustrating an electronic device 10 according to an embodiment of the present invention, wherein the electronic device 10 comprises a host device 50 and a memory device 100. The host device 50 may comprise: at least one processor 52 (such as one or more processors) arranged to control operations of the host device 50; and a power supply circuit 54, coupled to the above processor 52, and arranged to provide power to the processor 52 and the memory device 100 mentioned above and output one or more driving voltages to the memory device 100, wherein the memory device 100 may provide storage space for the host device 50, and may obtain the one or more driving voltages from the host device 50 as the power source of the memory device 100. Examples of the host device 50 may include (but are not limited to): a multifunctional mobile phone, tablet, wearable device, and personal computer (e.g. a desktop computer or a laptop computer). Examples of the memory device 100 may include (but not limited to): a portable memory device (e.g. a memory card conforming to the SD/MMC, CF, MS, XD or UFS specification), a solid state drive (SSD) and all kinds of embedded storage devices (e.g. those conforming to the UFS or EMMC specification). According to this embodiment, the memory device 100 may comprise a controller such as a memory controller 110, and may further comprise a non-volatile (NV) memory 120, wherein the controller is arranged to access the NV memory 120, and the NV memory 120 is arranged to store information. The NV memory 120 may comprise a plurality of NV memory elements 122-1, 122-2, . . . , and 122-N, wherein the symbol "N" may represent an integer larger than 1. For example, the NV memory 120 may be a flash memory, and the NV memory elements 122-1, 122-2, . . . , and 122-N may be a plurality of flash memory chips (flash chips) or a plurality of flash memory dies (flash dies), but the present invention is not limited thereto.

As shown in FIG. 1, the memory controller 110 may comprise a processing circuit such as a microprocessor 112, a storage such as a read only memory (ROM) 112M, a control logic circuit 114, a NV memory 116, and a transmission interface circuit 118, wherein at least one portion of these components may be coupled to one another via a bus. The NV memory 116 is implemented with a random access memory (RAM), e.g. a Static RAM (SRAM), but the present invention is not limited thereto. The NV memory 116 may be arranged to provide internal storage space for the memory controller 110, and may temporarily store data. Further, the ROM 112M of this embodiment is arranged to store a program code 112C, and the microprocessor 112 is arranged to execute the program code 112C to control access to the NV memory 120. Note that the program code 112C may also be stored into the NV memory 116 or any other type of memory. The control logic circuit 114 may be arranged to control the NV memory 120, and may comprise a plurality of sub-circuits, such as a randomizing/de-randomizing and error correction code (ECC) circuit 114E, an empty-page detection circuit 114A and a register circuit 114R, to simultaneously or non-simultaneously perform a plurality of operations, wherein the randomizing/de-randomizing and ECC circuit 114E may comprise a randomizer, a de-randomizer, an ECC encoder and an ECC decoder, but the present invention is not limited thereto. The transmission interface circuit 118 may conform to a specific communications specification, such as the Serial Advanced Technology Attachment (SATA) specification, Universal Serial Bus (USB) specification, Peripheral Component Interconnect Express (PCIE) specification, embedded Multi Media Card (eMMC) specification, or Universal Flash Storage (UFS) specification, and may perform communications according to the specific communications specification.

In this embodiment, the host device 50 may indirectly access the memory device 100 by transmitting a host command and a corresponding logic address to the memory controller 110. The memory controller 110 receives the host command and the logic address, translates the host command into a memory operating command (which can be called operating command, for brevity), and uses the operating command to control the NV memory 120 to read or write/program memory units or data pages of a specific physical address in the NV memory 120, wherein the physical address corresponds to the logic address. When the memory controller 110 performs an erase operation upon any NV memory element 122-n within the NV memory elements 122-1, 122-2, ... and 122-N (the symbol "n" may represent any integer within the interval [1, N]), at least one block within multiple blocks of the NV memory element 122-n will be erased, wherein each block within the multiple blocks may comprise multiple pages (such as data pages), and an access operation (e.g. read or write) maybe performed on one or more pages. Further, during a write operation, the memory controller 110 may respectively utilize the ECC encoder and the randomizer to perform ECC coding and randomizing to convert the original data to be stored in the NV memory 120 into a first data stream that has been encoded and randomized, for being stored into the NV memory 120. During a read operation, the memory controller 110 may respectively utilize the de-randomizer and the ECC decoder to perform de-randomizing and ECC decoding, to convert a second data stream read from the NV memory 120 into readout data. When the decoding performed by the ECC decoder succeeds, the readout data will equal the original data. For example, the ECC encoder may perform ECC coding upon the original data to protect the original data, and more particularly, may generate a codeword corresponding to the original data, wherein the codeword comprises the original data and its parity-check code; the randomizer may perform randomizing upon the codeword to generate the first data stream, and may keep the total bit number unchanged in this operation; the de-randomizer may perform de-randomizing upon the second data stream to generate a readout version of the codeword, and may keep the total bit number unchanged in this operation; and the ECC decoder may perform ECC decoding upon the readout version of the codeword to generate the readout data, wherein the ECC decoder may detect any possible error (if exists) in the readout data, and may attempt to perform error correction to obtain the readout data; wherein ECC coding may be performed prior to randomizing, and ECC decoding may be performed after de-randomizing, but the present invention is not limited thereto. According to some embodiments, ECC coding may be performed after randomizing, and ECC decoding may be performed prior to de-randomizing.

According to some embodiments, the mechanism shown in FIG. 1 may be modified. For example, the memory controller 110 may be divided into the following three parts: a core logic circuit which may comprise the processing circuit such as the microprocessor 112, the storage such as the ROM 112M, and the NV memory 116; a NAND flash controller which may comprise the control logic circuit 114; and a host controller which may comprise the transmission interface circuit 118; but the present invention is not limited thereto.

II. Empty-Page Detection Mechanism

The memory controller 110 may receive a plurality of host commands from the host device 50, execute the host commands, and then send an operation result back to the host device 50. More particularly, the microprocessor 112 may control the memory controller 110 according to a command (e.g. any of the host commands) from the host device 50, to allow the host device 50 to access the NV memory 120 via the memory controller 110. To perform the access management more effectively, the memory controller 110 may store the relationships between logic addresses and physical addresses into a plurality of logic-to-physical address mapping tables in the NV memory 120. As the relationships may change over time, and as the total information amount of the logic-to-physical address mapping tables may be extremely large, during the initialization of the memory device 100, the memory controller 110 may search the last valid page of at least one block within a plurality of predetermined blocks in the NV memory 120, and directly or indirectly search for the logic-to-physical address mapping tables according to reference information previously recorded in the spare region of the last valid page by the memory controller 110, in order to ensure that the memory device 100 operates correctly. The memory controller 110 may accelerate (e.g. speed up) the initialization of the memory device 100 via parallel processing of at least one portion of the plurality of sub-circuits of the control logic circuit 114, and more particularly, may simultaneously utilize the empty-page detection circuit 114A to perform empty-page detection, and utilize the randomizing/de-randomizing and ECC circuit 114E to perform de-randomizing and ECC decoding.

Figure 2:
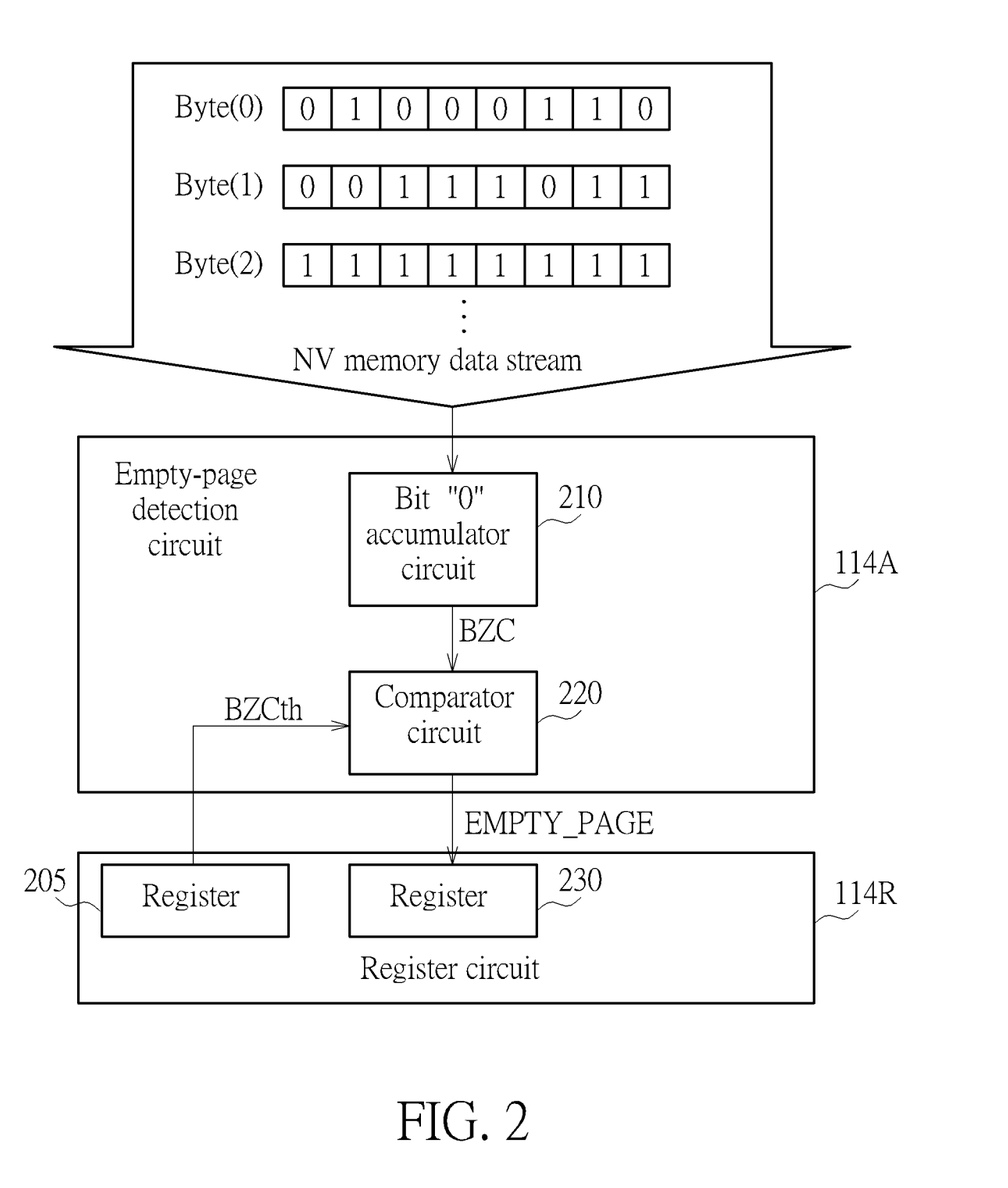
FIG. 2 illustrates implementation details of the memory device shown in FIG. 1 according to an embodiment of the present invention.

FIG. 2 illustrates implementation details of the memory device 100 shown in FIG. 1 according to an embodiment of the present invention, wherein the NV memory data stream comprising a plurality of bytes {Byte (0), Byte (1), Byte (2), ... } may be taken as an example of the second data stream. The empty-page detection circuit 114A may comprise a bit "0" accumulator circuit 210 and a comparator circuit 220, and the register circuit 114R may comprise registers 205 and 230. With aid of the registers 205 and 230, the control logic circuit 114 and the microprocessor 112 may exchange information to control some operations related to empty-page detections, but the present invention is not limited thereto. When needed, for example, when starting to perform empty-page detection upon a page of a block within the plurality of predetermined blocks mentioned above, the empty-page detection circuit 114A may reset the bit "0" accumulator circuit 210 in order to ensure the correctness of the empty-page detection. The bit "0" accumulator circuit 210 may accumulate the number of "0" bits in the second data stream (such as the NV memory data stream) by counting, for example, in order to generate or update a bit-zero count BZC. The comparator circuit 220 may obtain the bit-zero count threshold BZCth from the register 205, wherein the processing circuit, such as the microprocessor 112 may preset the bit-zero count threshold BZCth, and more particularly, may determine the bit-zero count threshold BZCth according to the coding/decoding capability of the randomizing/de-randomizing and ECC circuit 114E (e.g. the ECC encoder/ECC decoder therein). For example, when the maximum number of error bits in each 1024 bytes data that can be corrected by the randomizing/de-randomizing and ECC circuit 114E is 40, the microprocessor 112 may also set the bit-zero count threshold BZCth as 40 (BZCth=40), but the present invention is not limited thereto. By comparing the bit-zero count BZC with the bit-zero count threshold BZCth, the comparator circuit 220 may determine whether the bit-zero count BZC is smaller than or equal to the bit-zero count threshold BZCth in order to generate the empty-page detection signal EMPTY_PAGE, wherein the empty-page detection signal EMPTY_PAGE may indicate whether the bit-zero count BZC is smaller than or equal to the bit-zero count threshold BZCth. For example, when the bit-zero count BZC is smaller than or equal to bit-zero count threshold BZCth, the empty-page detection signal EMPTY_PAGE may carry the logic value 1 to indicate that the page is an empty page; otherwise, the empty-page detection signal EMPTY_PAGE may carry the logic value 0 to indicate that the page is not an empty page. The present invention is not limited thereto, however. The comparator circuit 220 may output the empty-page detection signal EMPTY_PAGE to the register 230, in order to store the logic value (e.g. 1 or 0) carried by the empty-page detection signal EMPTY_PAGE as a corresponding bit in the register 230.

For better understanding, assume that the page may comprise M codewords, wherein M may represent a positive integer. More precisely, the size of the page may be equal to the size of the M codewords, and the page in the NV memory 120 may be stored as a coded and randomized version of the M codewords. The empty-page detection circuit 114A may perform M partial empty-page detection operations respectively corresponding to the M codewords, and the register 230 may correspondingly store M bits to respectively indicate respective detection results of the M partial empty-page detection operations. Before any partial empty-page detection operation in the M partial empty-page detection operations is performed, the empty-page detection circuit 114A may reset the bit "0" accumulator circuit 210. During the partial empty-page detection operation, the bit "0" accumulator circuit 210 may accumulate the amount of "0" bits in a partial data streams of the second data stream, such as the amount of the "0" bits within a plurality of bits corresponding to a codeword, to generate the latest value of the bit-zero count BZC during the partial empty-page detection operation. By comparing the bit-zero count BZC (in the partial empty-page detection operation) with the bit-zero count threshold BZCth, the comparator circuit 220 may determine whether the bit-zero count BZC is smaller than or equal to the bit-zero count threshold BZCth, in order to generate the empty-page detection signal EMPTY_PAGE, wherein the logic value (e.g. 1 or 0) carried by the empty-page detection signal EMPTY_PAGE is stored as a certain bit within the M bits that corresponds to the partial empty-page detection operation. After the M partial empty-page detection operations are completed, the microprocessor 112 may obtain the M bits from register 230. The microprocessor 112 may determine whether the page is an empty page according to the M bits, and more particularly, may check whether each of the M bits indicates that the page may be an empty page (e.g. each of the M bits is equal to the logic value 1), or check whether any of the M bits indicates that the page is not an empty page (e.g. any of the M bits equals the logic value 0). When each of the M bits equals to the logic value 1, the microprocessor 112 may determine that the page is an empty page; otherwise, the microprocessor 112 may determine that the page is not an empty page. Note that the above example is merely for illustrative purposes, rather than a limitation of the present invention.

The bytes {Byte (0), Byte (1), Byte (2), . . . } may be taken as an example of the partial data stream. The first three bytes {Byte (0), Byte (1), Byte (2)} are 01000110, 00111011 and 11111111, respectively, and the respective numbers of bit "0" are 5, 3 and 0. The bit "0" accumulator circuit 210 may accumulate these values to obtain the latest value of the bit-zero count BZC (e.g., (5+3+0)=8). Assuming that all of the remaining bytes of the bytes {Byte (0), Byte (1), Byte (2), . . . } are read 11111111, this represents that all the subsequent bits in the partial data stream are 1, and therefore BZC=8. In the situation where BZC=8 and BZCth=40, the comparator circuit 220 may detect the result "BZC<BZCth" and that the empty-page detection signal EMPTY_PAGE carries logic value 1, and may therefore set the bit corresponding to the partial empty-page detection operation to have logic value 1.

III. System Management

Figure 3:
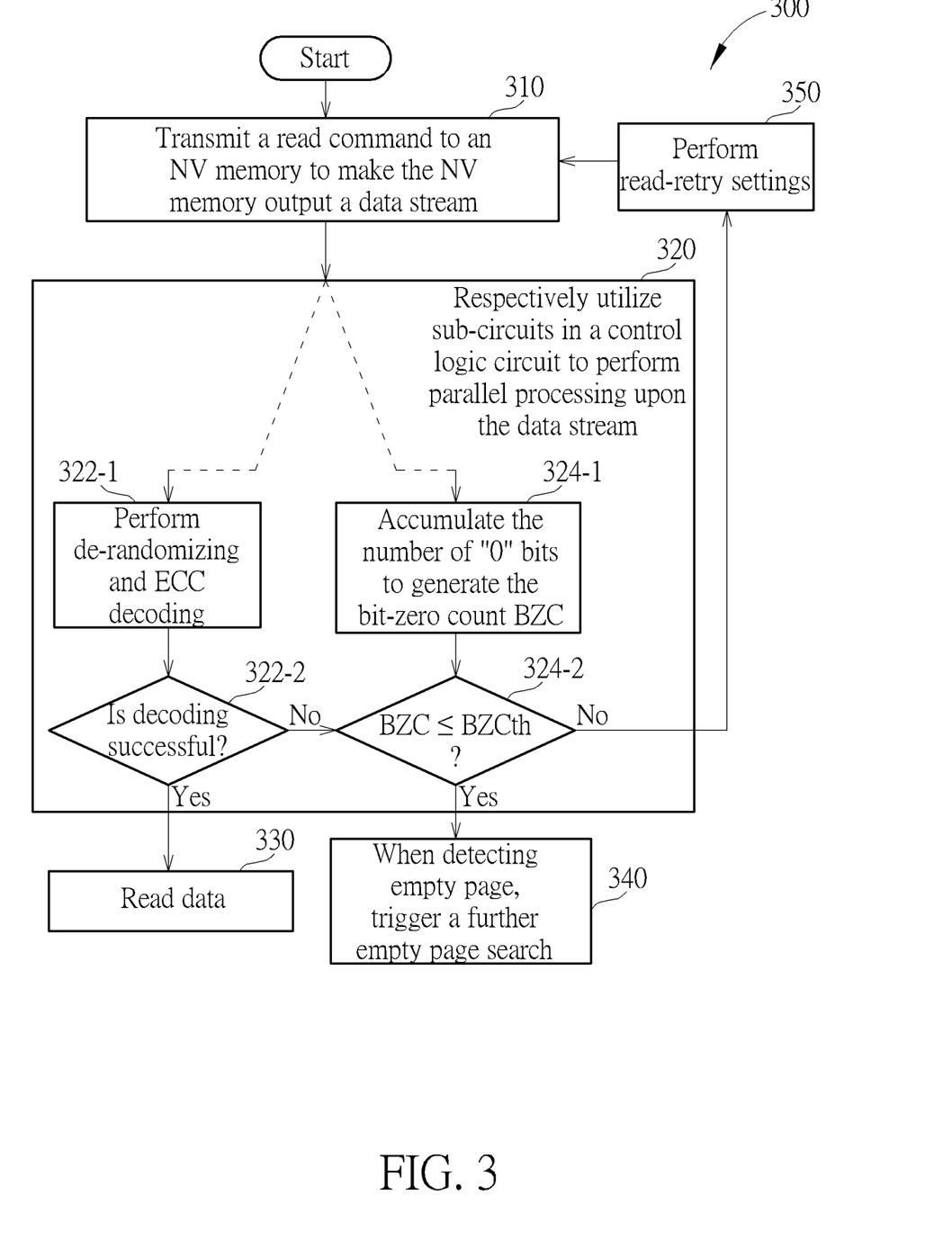
FIG. 3 is a flowchart illustrating a method for controlling operations of a memory device according to an embodiment of the present invention.

FIG. 3 is a flowchart illustrating a method 300 for controlling operations of a memory device according to an embodiment of the present invention, wherein the method 300 may be applied to the electronic device 10 and the memory device 100, and may be applied to the controller such as the memory controller 110. More particularly, the method 300 may be applied to the processing circuit such as the microprocessor 112.

In Step 310, the memory controller 110 (e.g. the microprocessor 112 therein) may transmit a read command to the NV memory 120 to make the NV memory 120 output a data stream (e.g. the second data stream, such as a partial data stream thereof), wherein the data stream may represent the page of the block in the predetermined blocks.

In Step 320, the memory controller 110 (e.g. the microprocessor 112 therein) may respectively utilize the sub-circuits in the control logic circuit 114 to perform parallel processing upon the data stream, such as the parallel processing respectively corresponding to Steps {322-1, 322-2} and Steps {324-1, 324-2}. More particularly, the memory controller 110 may perform parallel processing upon the data stream to accelerate the initialization of the memory device 100, but the present invention is not limited thereto.

In Step 322-1, the memory controller 110 (e.g. the microprocessor 112 therein) may utilize the randomizing/de-randomizing and ECC circuit 114E (e.g. the de-randomizer and ECC decoder therein) to perform de-randomizing and ECC decoding, more particularly, perform de-randomizing and ECC decoding according to the data stream, wherein performing de-randomizing and ECC decoding according to the data stream may relate to the initialization of the memory device 100. According to this embodiment, the memory controller 110 (e.g. the microprocessor 112 therein) may utilize the randomizing/de-randomizing and ECC circuit 114E to perform de-randomizing and ECC decoding according to the data stream, to search for associated information of the initialization of the memory device 100 in the page.

In Step 322-2, the memory controller 110 (e.g. the microprocessor 112 therein) may utilize the randomizing/de-randomizing and ECC circuit 114E (e.g. the ECC decoder)

to check whether the decoding succeeds. If the decoding succeeds, Step 330 is entered; otherwise, Step 324-2 is entered.

In Step 324-1, the memory controller 110 (e.g. the microprocessor 112 therein) may utilize the empty-page detection circuit 114A (e.g. the bit "0" accumulator circuit 210 therein) to accumulate the number of "0" bits, to generate the bit-zero count BZC.

In Step 324-2, the memory controller 110 (e.g. the microprocessor 112 therein) may utilize the empty-page detection circuit 114A (e.g. the comparator circuit 220) to check whether the bit-zero count BZC is equal to or smaller than BZCth (BZC≤BZCth). Through the operations of Step 324-1 and Step 324-2, the memory controller 110 (e.g. the microprocessor 112 therein) may utilize the empty-page detection circuit 114A to perform empty-page detection according to the data stream, wherein performing empty-page detection according to the data stream may relate to accelerating the initialization of the memory device 100. According to this embodiment, the memory controller 110 (e.g. the microprocessor 112 therein) may utilize the empty-page detection circuit 114A to perform empty-page detection according to the data stream, to determine whether the page is an empty page. For example, by utilizing the empty-page detection circuit 114A to perform empty-page detection, the memory controller 110 (e.g. the microprocessor 112 therein) may decrease the probability of searching for the associated information of the initialization of the memory device 100 in any empty page. When it is determined that BZC is equal to or smaller than BZCth (BZC≤BZCth), Step 340 is entered; otherwise, Step 350 is entered.

In Step 330, the memory controller 110 (e.g. the microprocessor 112 therein) may read data, such as the data obtained when the ECC decoding succeeds, in order to obtain the associated information of the initialization of the memory device 100 from read data, wherein the read data may comprise reference information in the spare region of the page, and the reference information may be taken as an example of the associated information. In this situation, the page may be taken as an example of the last valid page.

In Step 340, when detecting empty page, the memory controller 110 (e.g. the microprocessor 112 or the empty-page detection circuit 114A therein) may trigger a further empty page search. According to this embodiment, when it is detected that the page is an empty page, the memory controller 110 (e.g. the microprocessor 112 or the empty-page detection circuit 114A therein) may trigger empty-page detection of another page in the NV memory 120, to determine whether the other page is an empty page. For example, regarding the previous page (if it exists) of the page in the same block, the memory controller 110 may perform similar operations on this previous page according to the method 300. In another example, regarding a certain page (such as the last page) in another block, the memory controller 110 may perform similar operations on this page according to the method 300.

In Step 350, the memory controller 110 (e.g. the microprocessor 112 therein) may perform read-retry settings. For example, regarding the same page in the same block, the memory controller 110 may adjust some read control parameters of the NV memory 120, such as a voltage threshold for determining bit information when reading the NV memory 120, but the present invention is not limited thereto.

In regard to the checking result in Step 322-2, the outcome "Yes" of "Decoding succeed?" may represent that the page comprises valid data, and the outcome "No" of "Decoding succeed?" may represent that the page does not comprise valid data. When this checking result of "Decoding fail?" is "No" and the page is also an empty page, directly performing read-retry upon the page in an attempt to re-decode the page can be very time-consuming (e.g. the re-decoding of the read-retry under this situation cannot succeed, resulting in the read-retry being performed many times until abort, for example), thereby making the overall system booting time too long. According to this embodiment, in the situation where the checking result of "Decoding fail" is "Yes", the memory controller 110 may confirm whether the page is an empty page according to the detection result of the empty-page detection beforehand (e.g. enter Step 324-2), rather than directly performing read-retry upon the page. Hence, the method (such as the method 300) and associated mechanism (such as the electronic device 10, the memory device 100 and the memory controller 110) of the present invention may determine whether a certain page is an empty page by merely performing one single page-reading once, wherein if the page is determined as an empty page, read-retry is skipped; otherwise (if the page is determined as a non-empty page), read-retry is performed, which may reduce process time by a significant amount.

A typical characteristic of the empty page is that the whole randomized page is full of "1" bits. Since a small amount of errors may appear in the NV memory 120, regarding the empty page, the bits read from the NV memory 120 will typically include a few "0" bits, rather than all the bits being "1". When a randomized version of a specific page in the NV memory 120 is mostly comprised of "1" bits (e.g. BZC≤BZCth; or the logic value of each of the M bits is 1), the memory controller 110 may correctly and quickly determine this page as an empty page. According to some embodiments, the memory controller 110 (e.g. the microprocessor 112 therein) may analyze the state of the NV memory 120 according to the M bits; for example, by determining which pages are un-programmed pages or empty pages, but the present invention is not limited thereto.

Figure 4:
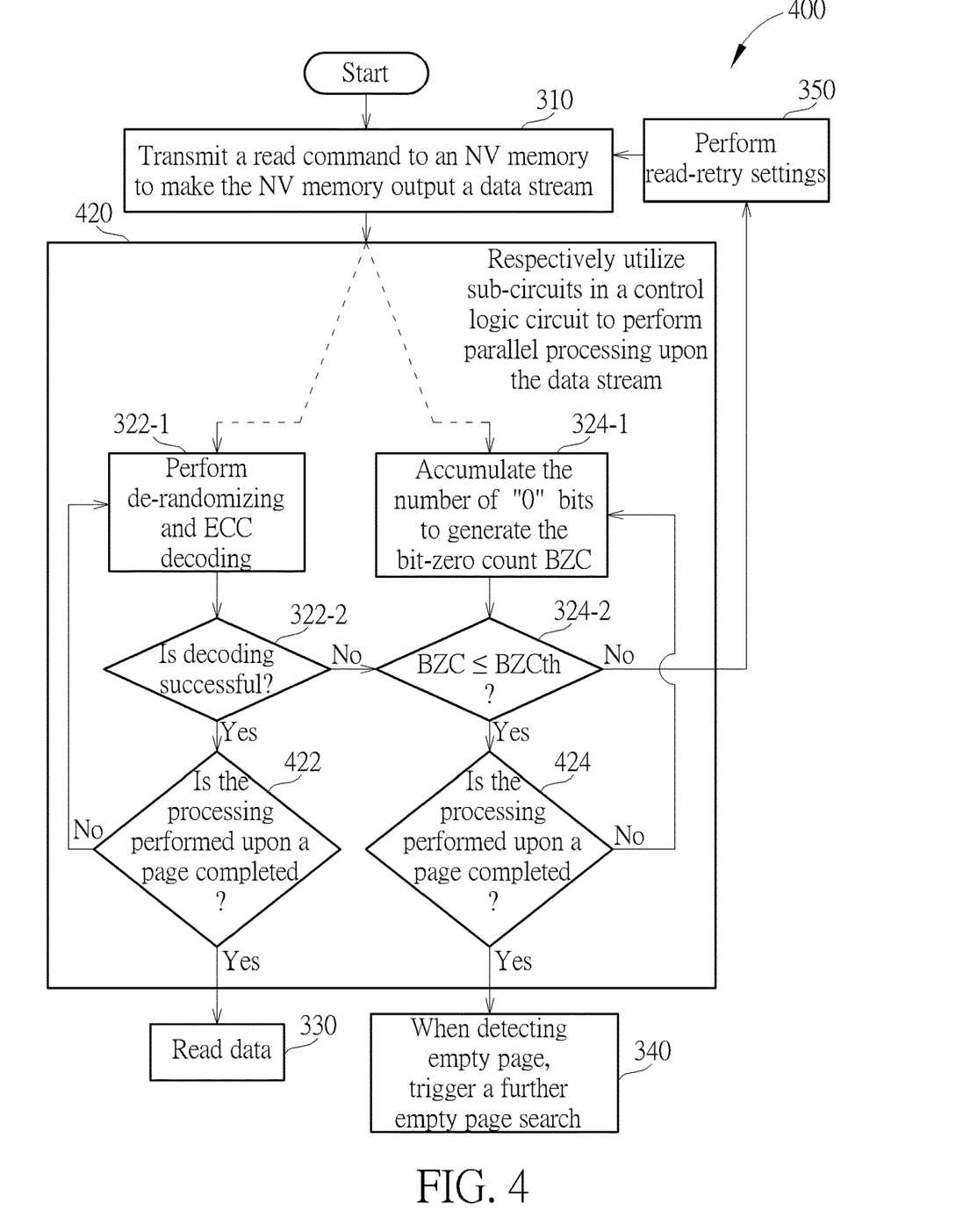
FIG. 4 illustrates a working flow of the method shown in FIG. 3 according to an embodiment of the present invention.

FIG. 4 illustrates a working flow 400 of the method 300 shown in FIG. 3 according to an embodiment of the present invention. The respective operations in Steps 310, 330, 340 and 350 may be the same as those mentioned previously.

In Step 420, the memory controller 110 (e.g. the microprocessor 112 therein) may respectively utilize the sub-circuits in the control logic circuit 114 to perform parallel processing upon the data stream, such as the parallel processing respectively corresponding to Steps {322-1, 322-2, 422} and Steps {324-1, 324-2, 424}. More particularly, the memory controller 110 may perform parallel processing upon the data stream to accelerate the initialization of the memory device 100, wherein operations of Steps {322-1, 322-2} and Steps {324-1, 324-2} may be identical to those mentioned previously, and the parallel processing may comprise processing corresponding to a page, but the present invention is not limited thereto.

In Step 422, the memory controller 110 (e.g. the microprocessor 112 therein) may utilize the randomizing/de-randomizing and ECC circuit 114E (e.g. the ECC decoder) to check whether the processing performed upon a page is completed. For example, the page may comprise the M codewords, and when the M codewords are all decoded successfully, the processing corresponding to Steps {322-1, 322-2, 422} may be performed M times for the M codewords, respectively. When the processing upon the page is completed, Step 330 is entered; otherwise, Step 322-1 is entered.

In Step 424, the memory controller 110 (e.g. the microprocessor 112 therein) may utilize the empty-page detection circuit 114A to check whether the processing upon a page is completed. For example, the page may comprise the M codewords, and when each of the M bits is logic value 1 (which represents that "BZC≤BZCth" is valid in each of the M partial empty-page detection operations), the process corresponding to Steps {324-1, 324-2, 424} may be performed M times for the M codewords, respectively. When processing of the processing upon the page is completed, Step 340 is entered; otherwise, Step 324-1 is entered.

Content in this embodiment which is similar to that mentioned in previous embodiments is omitted here for brevity.

Figure 5:
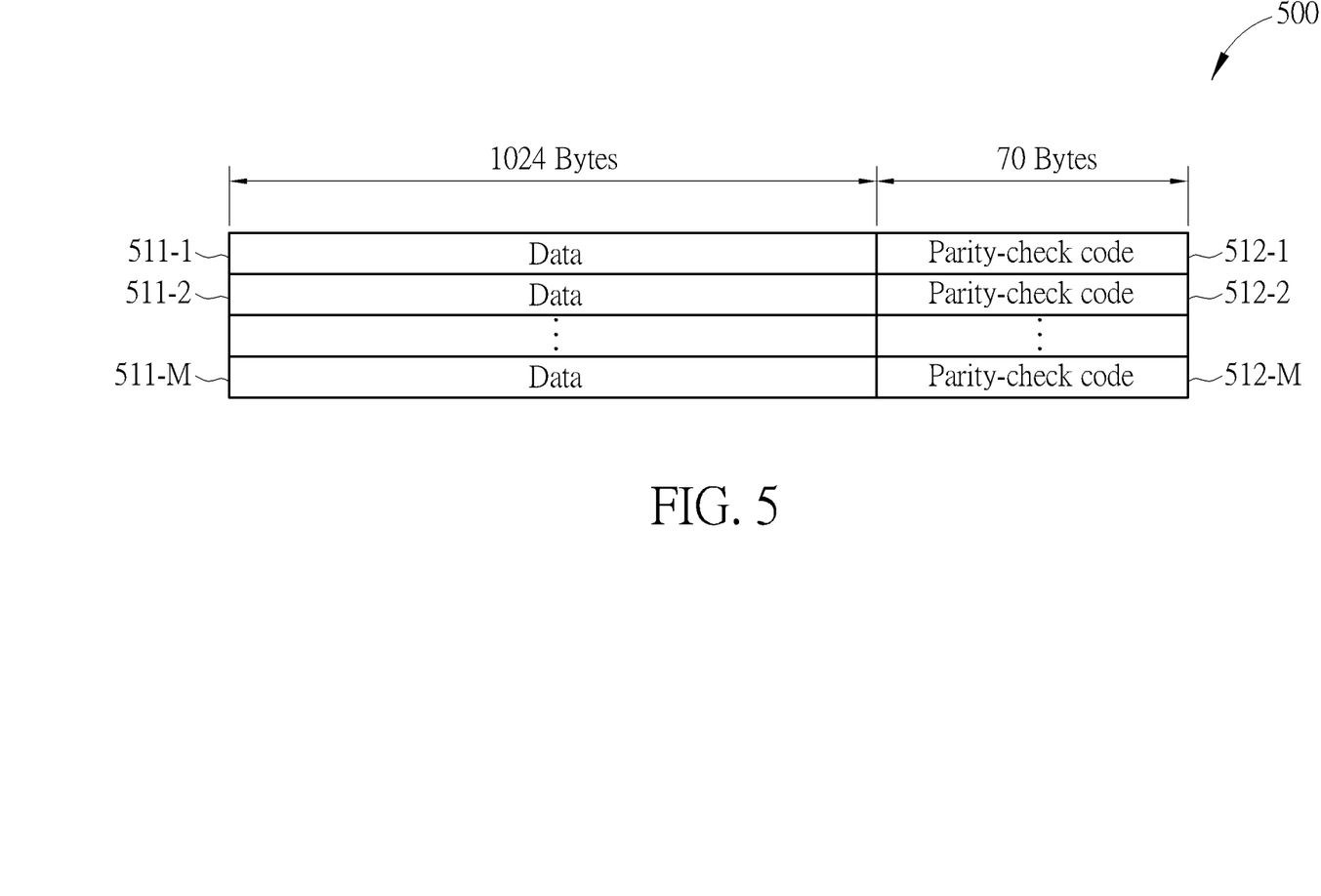
FIG. 5 is a diagram illustrating an encoding/decoding control scheme of the method shown in FIG. 3 according to an embodiment of the present invention.

FIG. 5 is a diagram illustrating an encoding/decoding control scheme of the method 300 shown in FIG. 3 according to an embodiment of the present invention. The page 500 shown in FIG. 5 may be an example of the above-mentioned page. The page 500 may comprise data {511-1, 511-2, ..., 511-M} and the respective parity-check codes {512-1, 512-2, ..., 512-M} thereof, wherein the data amount of each of the data {511-1, 511-2, ..., 511-M} may be 1024 bytes, and the data amount of each of the parity-check codes {512-1, 512-2, ..., 512-M} may be 70 bytes, but the present invention is not limited thereto. The codeword comprising the data 511-1 and the parity-check code 512-1, the codeword comprising the data 511-2 and the parity-check code 512-2, ..., and the codeword comprising the data 511-M and the parity-check code 512-M may be taken as examples of the above-mentioned M codewords, respectively. For brevity, some description of this embodiment which is similar to that of any of the previous embodiments is omitted here.

According to some embodiments, the memory controller 110 (e.g. the microprocessor 112 therein) may utilize the empty-page detection circuit 114A to temporarily turn off the de-randomizer in order to obtain the data stream mentioned in Step 310, but the present invention is not limited thereto. According to some embodiments, the memory controller 110 (e.g. the microprocessor 112 therein) may utilize the empty-page detection circuit 114A to invert the second data stream in order to obtain an inversed data stream of the second data stream, wherein bits "1" in the inversed data stream are changed from bits "0" in the second data stream, and bits "0" in the inversed data stream are changed from bits "1" in the second data stream. For example, the empty-page detection circuit 114A may comprise an inverter to perform the inverting operation, and the bit "0" accumulator circuit 210 may be replaced with a bit "1" accumulator circuit in this example, wherein the bit-zero count BZC may be replaced with a bit-one count BOC, and the bit-zero count threshold BZCth may be replaced with a bit-one count threshold BOCth. The bit "1" accumulator circuit may accumulate the amount of bits "1" in the inversed data stream in order to generate the bit-one count BOC. For example, the bit-one count threshold BOCth may be equal to the bit-zero count threshold BZCth. Further, the memory controller 110 (e.g. the microprocessor 112 therein) may utilize the randomizing/de-randomizing and ECC circuit 114E (e.g. the ECC decoder) to attempt to perform ECC decoding upon the inversed data of the inversed data stream. When the decoding succeeds, the memory controller 110 (e.g. the microprocessor 112 or the ECC decoder) may determine that the page corresponding to the inversed data is an empty page. For brevity, some description of this embodiment which is similar to that of any of the previous embodiments is omitted here.

According to some embodiments, the memory controller 110 (e.g. the microprocessor 112 therein) may select a portion of blocks from respective blocks of the NV memory elements 122-1, 122-2, ... and 122-N as the predetermined blocks. For example, the selecting operation may base on a predetermined rule. Further, the memory controller 110 (e.g. the microprocessor 112 therein) may record corresponding reference information (such as the location information of a certain logic-to-physical address mapping table of the logic-to-physical address mapping tables) into a spare region of any page of a plurality of pages of any block in the predetermined blocks, find the logic-to-physical address mapping table according to the location information, and find physical block for storing this page according to the logic-to-physical address mapping table in order to access this page, but the present invention is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for controlling operations of a memory device, the memory device comprising a non-volatile (NV) memory, the NV memory comprising at least one NV memory element, the method comprising:
   transmitting a read command to the NV memory to make the NV memory output a data stream, wherein the data stream represents a page of a block of a plurality of predetermined blocks in the NV memory; and
   respectively utilizing a plurality of sub-circuits in a control logic circuit of a controller of the memory device to perform parallel processing upon the data stream, wherein the memory device comprises the controller, the sub-circuits comprise a randomizing/de-randomizing and error correction code (ECC) circuit and an empty-page detection circuit, and respectively utilizing the sub-circuits to perform parallel processing upon the data stream comprises:
   utilizing the randomizing/de-randomizing and ECC circuit to perform de-randomizing and ECC decoding according to the data stream, wherein performing de-randomizing and ECC decoding according to the data stream is related to initialization of the memory device; and
   utilizing the empty-page detection circuit to perform empty-page detection according to the data stream, wherein performing empty-page detection according to the data stream is related to accelerating the initialization of the memory device.

2. The method of claim 1, wherein the step of utilizing the randomizing/de-randomizing and ECC circuit to perform de-randomizing and ECC decoding according to the data stream further comprises:
   utilizing the randomizing/de-randomizing and ECC circuit to perform de-randomizing and ECC decoding according to the data stream, to search for associated information of the initialization of the memory device in the page.

3. The method of claim 2, further comprising:
   reading data obtained when ECC decoding succeeds, to obtain the associated information of the initialization of the memory device from the data.

4. The method of claim 1, wherein the step of utilizing the empty-page detection circuit to perform the empty-page detection according to the data stream further comprises:
   utilizing the empty-page detection circuit to perform empty-page detection according to the data stream to determine whether the page is an empty page, wherein by utilizing the empty-page detection circuit to perform the empty-page detection, a probability of searching for associated information of the initialization of the memory device in any empty page is decreased.

5. The method of claim 4, further comprising:
when it is detected that the page is an empty page, triggering empty-page detection of another page in the NV memory, to determine whether the other page is an empty page.

6. The method of claim 1, wherein the step of respectively utilizing the sub-circuits in the control logic circuit of the controller of the memory device to perform parallel processing upon the data stream further comprises:
respectively utilizing the sub-circuits to perform parallel processing upon the data stream, to accelerate the initialization of the memory device.

7. The method of claim 1, further comprising:
during initialization of the memory device, searching for a last valid page of at least one block of the predetermined blocks, and directly or indirectly obtaining a plurality of logical-to-physical address mapping tables of the memory device according to reference information previously recorded in a spare region of the last valid page by the controller, to ensure that the memory device operates correctly.

8. A memory device, comprising:
a non-volatile memory (NV) memory, arranged to store information, wherein the NV memory comprises at least one NV memory element; and
a controller, coupled to the NV memory, the controller arranged to control at least one operation of the memory device, wherein the controller comprises:
a control logic circuit, coupled to the NV memory, the control logic circuit arranged to control the NV memory, wherein the control logic circuit comprises:
a randomizing/de-randomizing and error correction code (ECC) circuit, arranged to perform at least one of randomizing, de-randomizing, ECC coding and ECC decoding; and
an empty-page detection circuit, arranged to perform empty-page detection; and
a processing circuit, coupled to the control logic circuit, the processing circuit arranged to control the controller according to a command from a host device, to allow the host device to access the NV memory via the controller, wherein under the control of the processing circuit, the controller performs the following operations:
transmitting a read command to the NV memory, to make the NV memory output a data stream, wherein the data stream represents a page of a block of a plurality of predetermined blocks in the NV memory; and
respectively utilizing a plurality of sub-circuits in the control logic circuit to perform parallel processing upon the data stream, wherein the sub-circuits comprise the randomizing/de-randomizing and ECC circuit and the empty-page detection circuit, and respectively utilizing the sub-circuits to perform parallel processing upon the data stream comprises:
utilizing the randomizing/de-randomizing and ECC circuit to perform de-randomizing and ECC decoding according to the data stream, wherein performing de-randomizing and ECC decoding according to the data stream is related to initialization of the memory device; and
utilizing the empty-page detection circuit to perform empty-page detection according to the data stream, wherein performing empty-page detection according to the data stream is related to accelerating the initialization of the memory device.

9. The memory device of claim 8, wherein the controller utilizes the randomizing/de-randomizing and ECC circuit to perform de-randomizing and ECC decoding according to the data stream, to search for associated information of the initialization of the memory device in the page.

10. The memory device of claim 9, wherein the controller reads data obtained when ECC decoding succeeds, to obtain the associated information of the initialization of the memory device from the data.

11. The memory device of claim 8, wherein the controller utilizes the empty-page detection circuit to perform empty-page detection according to the data stream, to determine whether the page is an empty page, wherein by utilizing the empty-page detection circuit to perform empty-page detection, the controller decreases a probability of searching for associated information of the initialization of the memory device in any empty page.

12. The memory device of claim 11, wherein when it is detected that the page is an empty page, the controller triggers empty-page detection of another page in the NV memory, to determine whether the other page is an empty page.

13. The memory device of claim 8, wherein the controller respectively utilizes the sub-circuits to perform parallel processing upon the data stream, to accelerate the initialization of the memory device.

14. An electronic device, comprising the memory device of claim 8, and further comprising:
the host device, coupled to the memory device, wherein the host device comprises:
at least one processor, arranged to control operations of the host device; and
a power supply circuit, coupled to the processor, the power supply circuit arranged to provide power to the processor and the memory device;
wherein the memory device is arranged to provide storage space for the host device.

15. A controller of a memory device, the memory device comprising the controller and a non-volatile (NV) memory, the NV memory comprising at least one NV memory element, the controller comprising:
a control logic circuit, coupled to the NV memory, the control logic circuit arranged to control the NV memory, wherein the control logic circuit comprises:
a randomizing/de-randomizing and error correction code (ECC) circuit, arranged to perform at least one of randomizing, de-randomizing, ECC coding and ECC decoding; and
an empty-page detection circuit, arranged to perform empty-page detection; and
a processing circuit, coupled to the control logic circuit, the processing circuit arranged to control the controller according to a command from a host device, to allow the host device to access the NV memory via the controller, wherein under the control of the processing circuit, the controller performs the following operations:
transmitting a read command to the NV memory, to make the NV memory output a data stream, wherein the data stream represents a page of a block of a plurality of predetermined blocks in the NV memory; and respectively utilizing a plurality of sub-circuits in the control logic circuit to perform parallel processing upon the data stream, wherein the sub-circuits comprise the randomizing/de-randomizing and ECC circuit and the empty-page detection circuit, and respectively utilizing the sub-circuits to perform parallel processing upon the data stream comprises:

utilizing the randomizing/de-randomizing and ECC circuit to perform de-randomizing and ECC decoding according to the data stream, wherein performing de-randomizing and ECC decoding according to the data stream is related to initialization of the memory device; and utilizing the empty-page detection circuit to perform empty-page detection according to the data stream, wherein performing empty-page detection according to the data stream is related to accelerating the initialization of the memory device.

16. The controller of claim 15, wherein the controller utilizes the randomizing/de-randomizing and ECC circuit to perform de-randomizing and ECC decoding according to the data stream, to search for associated information of the initialization of the memory device in the page.

17. The controller of claim 16, wherein the controller reads data obtained when ECC decoding succeeds, to obtain the associated information of the initialization of the memory device from the data.

18. The controller of claim 15, wherein the controller utilizes the empty-page detection circuit to perform empty-page detection according to the data stream, to determine whether the page is an empty page, wherein by utilizing the empty-page detection circuit to perform empty-page detection, the controller decreases a probability of searching for associated information of the initialization of the memory device in any empty page.

19. The controller of claim 18, wherein when it is detected that the page is an empty page, the controller triggers empty-page detection of another page in the NV memory, to determine whether the other page is an empty page.

20. The controller of claim 15, wherein the controller respectively utilizes the sub-circuits to perform parallel processing upon the data stream, to accelerate the initialization of the memory device.

* * * * *